United States Patent

Ogata

[19]

[11] Patent Number: 5,845,170
[45] Date of Patent: Dec. 1, 1998

[54] DEVELOPING METHOD

[75] Inventor: Kunie Ogata, Yokohama, Japan

[73] Assignee: Tokyo Electron Limited, Tokyo, Japan

[21] Appl. No.: 912,236

[22] Filed: Aug. 15, 1997

[30] Foreign Application Priority Data

Aug. 20, 1996 [JP] Japan .................................. 8-235829

[51] Int. Cl.⁶ ........................... G03D 5/00; G03D 3/02
[52] U.S. Cl. ...................... 396/604; 396/611; 396/627
[58] Field of Search ................................. 396/604, 611,
396/627; 134/1, 3, 24, 34; 118/52, 302,
321, 56; 156/345, 634, 640; 428/548

[56] References Cited

U.S. PATENT DOCUMENTS

| 5,252,137 | 10/1993 | Tateyama et al. | 134/34 |
| 5,275,658 | 1/1994 | Kimura | 118/302 |
| 5,374,312 | 12/1994 | Hasebe et al. | 118/52 |
| 5,625,433 | 4/1997 | Inada et al. | 396/604 |

*Primary Examiner*—D. Rutledge
*Attorney, Agent, or Firm*—Oblon, Spivak, McClelland, Maier & Neustadt, P.C.

[57] ABSTRACT

A developing method comprising the steps of (a) keeping a wafer substantially horizontally such that a resist-coated surface is placed at a top portion, (b) starting a rotation of the wafer at a first speed N1, starting discharging developer from a nozzle at a position where the wafer is prevented from being applied thereon during the rotation of the wafer, and starting scan-moving the nozzle along the wafer as discharging developer, (c) starting a first deceleration for decelerating the rotation of the wafer while the nozzle is scan-moving, (d) stopping the scan-movement of the nozzle above a central area of the wafer when the rotation of the wafer reaches a second speed N2, (e) ending the first deceleration when the rotation of the wafer reaches a third speed N3, and (f) starting a second deceleration for decelerating the rotation of the wafer from the third speed N3 to a fourth speed N4 after rotating the wafer at the third speed N3, ending the second deceleration when the rotation of the wafer reaches at the fourth speed N4, and supplying developer onto the wafer while the wafer is being rotated at the fourth speed N4 such that a liquid film of developer having a uniform thickness is formed on the wafer to develop the resist coated on the wafer.

15 Claims, 12 Drawing Sheets

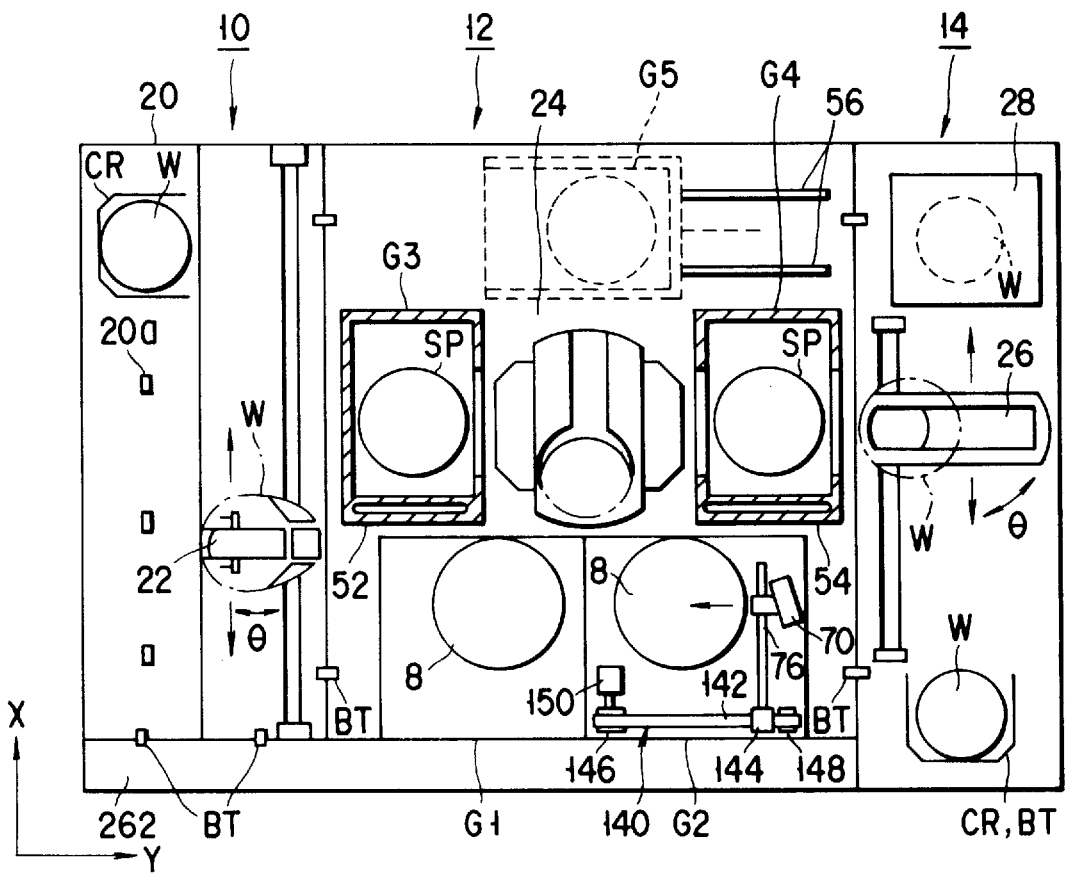
F I G. 2

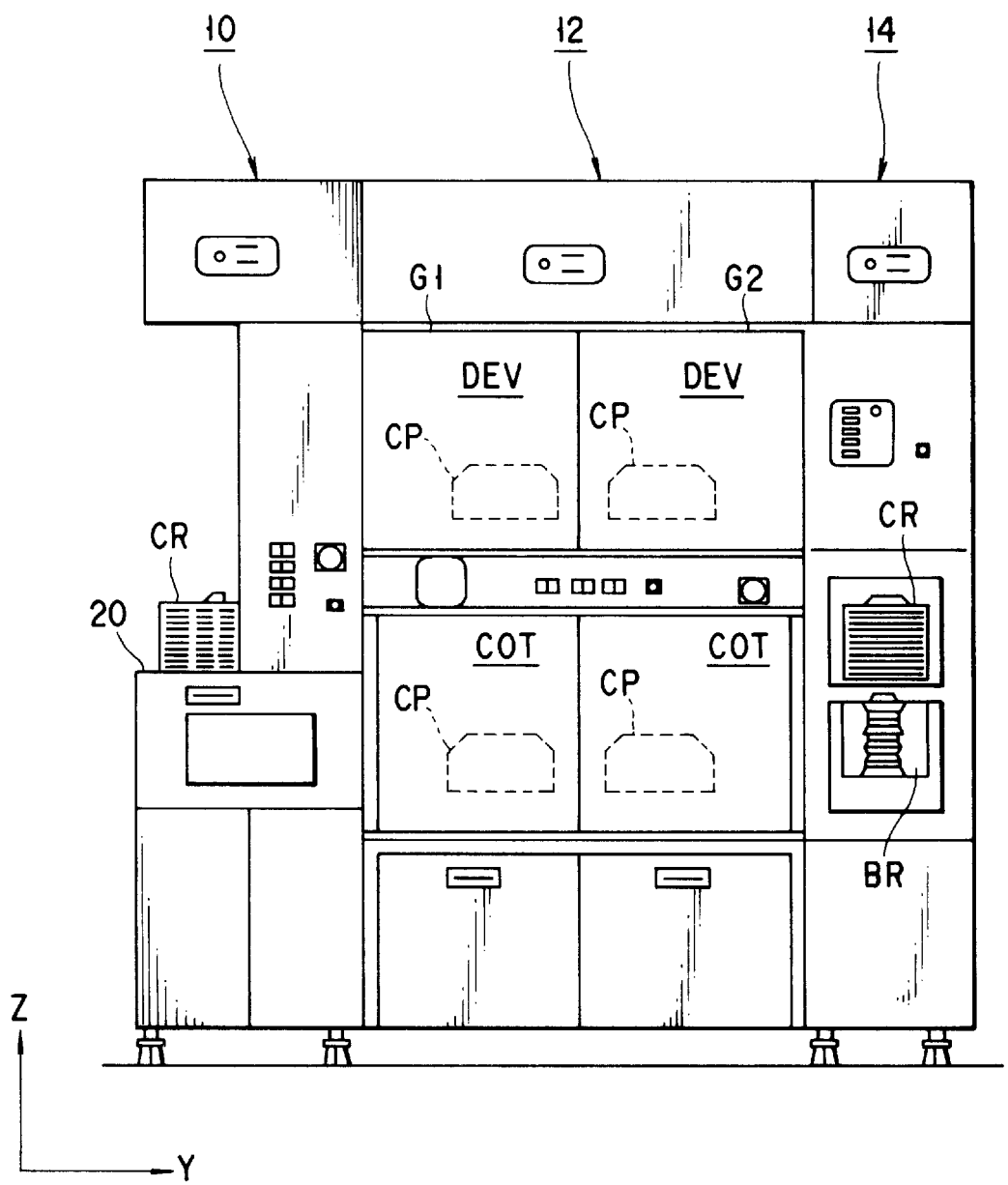
F I G. 3

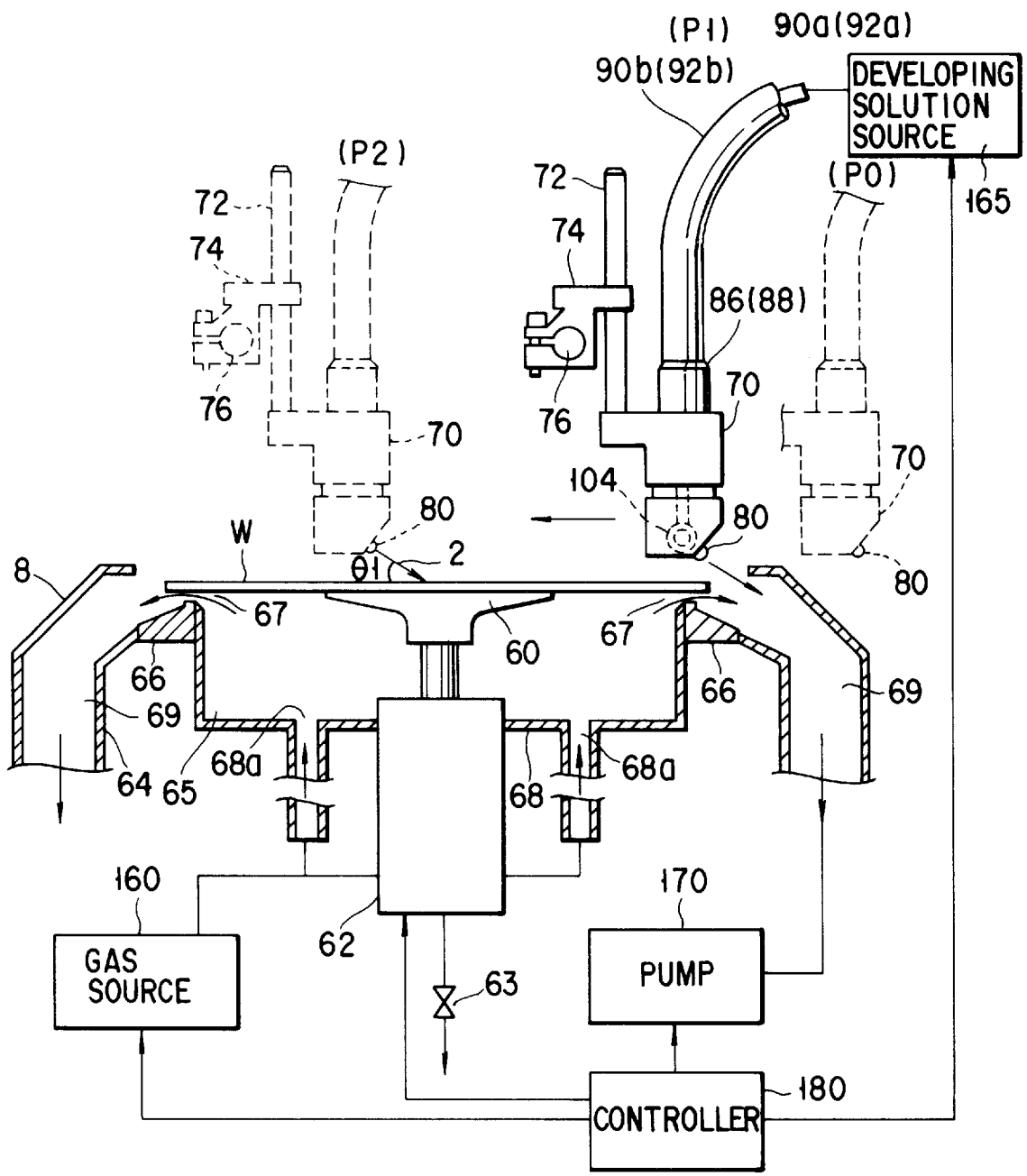
F I G. 5

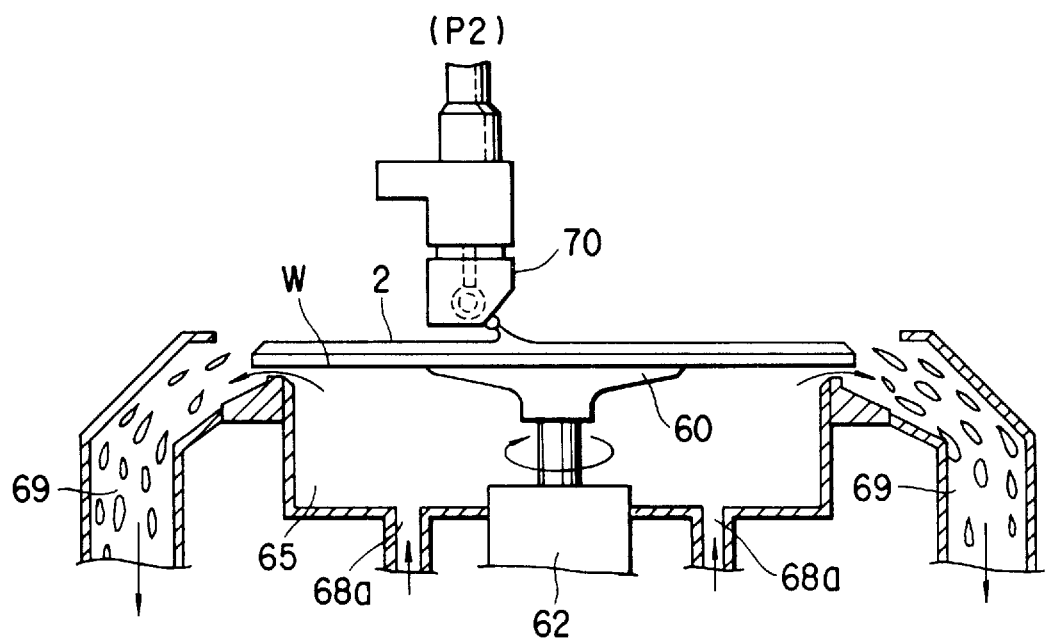
F I G. 9E
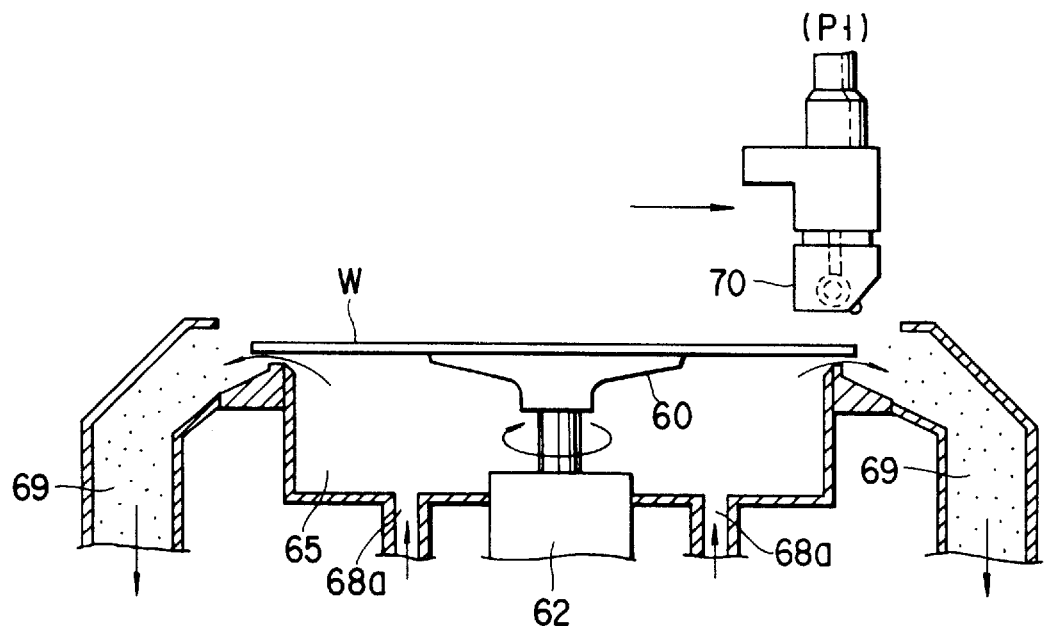
F I G. 9F

DEVELOPING METHOD

BACKGROUND OF THE INVENTION

The present invention relates to a developing method for developing photoresist on a substrate such as a semiconductor wafer, while supplying developer solution to the substrate which is being spin-rotated.

In the photolithography process of manufacturing semiconductor devices, photoresist is coated on a surface of the semiconductor wafer, is pattern-exposed, and developed. In the developing process, developer solution is continuously supplied to the water, which is being spin-rotated, through a nozzle. Then, an amount of supplying developer solution and an amount of natural drop are balanced, and a liquid film of developer solution 2 having substantially a uniform thickness is formed on the wafer W (liquid mounting on the wafer W).

In the developing method described in U.S. Pat. No. 5,625,433, as shown in FIG. 1, a nozzle 70 is moved from a home position (standby position) P0 to a first position P1, and developer solution 2 is dummy-dispensed in a drain cap. Moreover, the nozzle 70 is scan-moved from the first position P1 to a second position P2 while discharging developer solution 2 from the nozzle 70, so that developer solution 2 is supplied to the wafer, which is rotated at high speed. Furthermore, when the nozzle 70 reaches the second position P2, spin-rotation of the wafer W is decelerated, so that a liquid film of developer solution 2 having substantially a uniform thickness is formed on the wafer W (liquid mounting on the wafer W). If the value of deceleration is too much, reaction force (centripetal force) acts on developer solution 2 on the wafer. Then, as shown in FIG. 1, there occurs the so-called pull-back phenomenon in which developer solution 2 is pulled into the central area of the wafer W. As a result, developing defects are easily generated.

To prevent the generation of the pull-back phenomenon, the rotational speed of the wafer is once decelerated from high speed to intermediate speed. Then, the rotational speed is decelerated to the low speed from the intermediate speed. However, if such a stepwise deceleration of the wafer rotational speed is used, the amount of consumption of developing solution to be continuously supplied is increased. As a result, manufacturing cost is increased. Moreover, time, which is required for developing process, is increased, so that the entire throughput is decreased.

BRIEF SUMMARY OF THE INVENTION

An object of the present invention is to provide a developing method which an amount of consumption of developer solution can be reduced, and developing process time can be reduced.

FIG. 12 is a characteristic line view showing the result of examining influence exerted on the relationship between the number of spin-rotations of the wafer and the number of developing defects when the scan-moving speed of the nozzle is variously changed in a range of 40 to 150 rpm where a horizontal axis shows the number of wafer rotations (rpm) and a vertical axis shows the number of developing defects (number of detective openings). In this figure, curves E, F, G, and H show the results under the conditions of scan-moving speed, that is, 40 mm/sec, 60 mm/sec, 100 mm/sec, and 150 mm/sec, respectively. As is obvious from the figure, the number of developing defects was extremely small when the number of wafer rotations was in a range of more than 500 rpm and less than 1000 rpm. The number of developing defects is small to an allowable extent when the number of wafer rotations was in a range of more than 300 rpm and below 500 rpm. Moreover, in the low rotation speed area below 300 rpm and the high rotation speed area over 1000 rpm, the number of developing detects was increased to a careful extent. Also, when the number of wafer rotation number was around 1000 rpm, the number of developing defects became minimum.

FIG. 13 is a characteristic line view showing the result of examining influence exerted on the relationship between pre-wet time and the number of developing defects where a horizontal axis shows pre-wet time (sec) and a vertical axis shows the number of developing defects (number of detective openings). In this figure, curve J shows the result when the scan-moving speed of the nozzle is 40 mm/sec, and curve K shows the result when the scan-moving speed of the nozzle is 100 mm/sec. As is obvious from the figure, there was no significant difference between the respective scan-moving speed in the number of developing defects.

From the above results, the following points can be inferred.

As shown in FIGS. 11A and 11B, during the time when the nozzle 70 is scan-moved to the upper portion of wafer W from the outer first position P1, an area, which is wetted with developing solution 2, and an area, which is not wetted with developing solution 2, are mixed. At this time, even if the wafer rotation is decelerated, a good developing process having little developing defects can be carried out as long as the deceleration value is in the range of 300 to 500 rpm. As shown in FIG. 11C, even after the nozzle 70 reaches the second position P2, the deceleration of the wafer rotation is continued, so that the wafer rotation is smoothly changed from the high speed to the intermediate speed.

The present invention was completed based on the above recognition. In other words, in the first half of the nozzle movement, the rotation speed of wafer W is kept to be the first rotation speed rpm. In the second half, at the time when about 60% of the area of the wafer surface is pre-wetted (after 0.5 seconds), the deceleration is started. In this case, the lower limit value of the deceleration is set to be a range of 300 to 500 rpm of the second rotation speed N2 having little developing defects at the second position P2 (after 1 second). As shown in characteristic line A of FIG. 10, according to the embodiment of the present invention, the rotation speed of wafer W is controlled to be 500 rpm when the nozzle 70 is positioned at a position Px. On the other hand, as shown in characteristic line B of FIG. 10, in the conventional method, the rotation speed of 100 rpm is maintained as it is until the nozzle 70 reaches the second position P2.

In this case, the importance point lies in the value of the speed at the time of decelerating from the high speed rotation N1 to the intermediate rotation speed N2. More specifically, if the value of deceleration is too much, centripetal force (reaction force) acts on developer solution on the wafer 2 too much. Then, there may occur the pull back phenomenon in which developer solution is pulled into the central area of the wafer. If the pull back phenomenon occurs, bubbles are involved in the liquid layer of developing solution 2, the developing detect is easily generated. On the other hand, if the value of the deceleration is too small, the deceleration required time is prolonged, developing solution discharging time is increased, and the consumption amount of the developing solution is increased.

As the result of reviewing the above problem through several experiments, the Examiner found out the following point.

More specifically, if the value of the deceleration is set to the value corresponding to the high speed first rotation speed, for example, around 1000 rpm/sec, the pull back to the developing defects can be effectively prevented. As shown in FIG. 10, the value of the deceleration is set to around 1000 rpm/sec, and the starting time of deceleration (nozzle position Px during the scan-moving) is fixed such that the wafer rotation speed becomes just 500 rpm after one second from the start of step S5 in the deceleration curve A.

According to the present invention, there is provided a developing method for developing photoresist coated on a substrate with developing solution comprising the steps of:
(a) keeping the substrate substantially horizontally such that a resist-applied surface is placed at a top portion;
(b) starting a rotation of the substrate at a first rotation speed N1, starting discharging developing solution from a nozzle at a position where the substrate is prevented from being sprayed thereon during the rotation of the substrate, and starting scan-moving the nozzle along the substrate as discharging developing solution;
(c) starting a first deceleration for decelerating the rotation of the substrate while the nozzle is scan-moving;
(d) stopping the scan-movement of the nozzle above a central area of the substrate when the rotation speed of the substrate reaches a second rotation speed N2;
(e) ending the first deceleration when the rotation speed of the substrate reaches a third rotation speed N3; and
(f) starting a second deceleration for decelerating the rotation of the substrate from the third rotation speed N3 to a fourth rotation speed N4 after rotating the substrate at the third rotation speed N3, ending the second deceleration when the rotation speed of the substrate reaches at the fourth rotation speed N4, and supplying developing solution onto the substrate while the substrate is being rotated at the fourth rotation speed N4 such that a liquid film of developer solution having substantially a uniform thickness is formed on the substrate to develop resist coated on the substrate.

The second rotation speed N2 is set to be in a range of 300 rpm or more to 500 rpm or less, favorably 500±5.

The third rotation speed N3 is set to 100±5 rpm, and the fourth rotation speed N4 is set to 30±2 rpm.

The first deceleration is set to be in a range of 1000±100 rpm/sec.

60 to 80% of the area of the resist-coated surface of the substrate contacts developing solution when the rotation of the substrate reaches the second rotation speed N2.

Pre-wet time from the start of supplying developing solution onto the substrate from the nozzle till the first deceleration is started is set to be a range of 0.3 to 0.5 seconds.

The scan-moving time of the nozzle is set to be in a range of 0.8 to 1.0 second.

The scan-moving time of the nozzle is set to be in a range of 60 to 100 rpm/sec.

Required time for the first deceleration is set to be 0.9 seconds.

Process time at the fourth rotation speed N4 is set to 2.5 seconds.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view showing an outline of the entire resist coating and developing system used in the developing method according to an embodiment of the present invention;

FIG. 3 is a front view showing the coating and developing system;

FIG. 5 is a block diagram showing an apparatus, which is shown by partially cut, and used in the developing method according to the embodiment of the present invention;

FIGS. 9A to 9F are vertically-sectioned views each showing the developing apparatus, seeing from the side, to explain a series of developing processes;

DETAILED DESCRIPTION OF THE INVENTION

Figure 1:
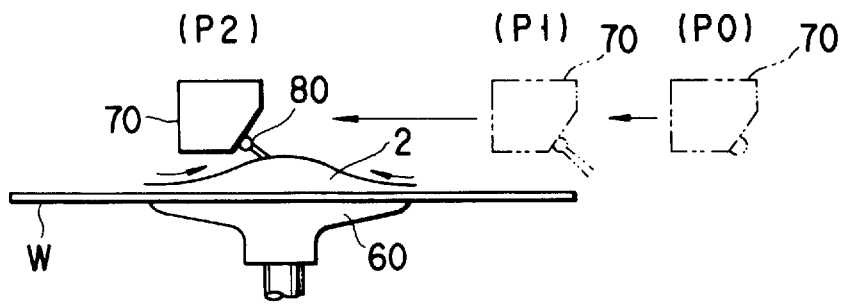
FIG. 1 is a schematic view showing a state of developing solution when a conventional developing method is used.

A preferred embodiment of the present invention will be described with reference to the accompanying drawings. The developing method according to an embodiment of the present invention is applied to a case in which a resist film coated on a semiconductor wafer is developed in this case.

A resist coating and developing system is provided in a clean room. Moreover, even in the system, the value of cleanness of each part is increased by efficient vertical layer flow system. The resist coating and developing system includes a cassette station 10, a process station 12, and an interface section 14. The cassette station 10 has a carrier mechanism for carrying a wafer cassette CR in and out of the system. A lot of 25-sheet of semiconductor wafers W are housed in the wafer cassette CR. The process station 12 includes various kinds of process unit needed for the resist coating and developing process. A wafer W is processed in each of the process units. These process units are stacked on upon the others. The interface section 14 includes a mechanism for transferring the wafer W between a next exposing apparatus (not shown) and the process station 12.

As shown in FIG. 2, four protrusions 20a are arranged on a cassette-mounted table 20 at the cassette station 10 and the wafer cassette CR is mounted on each of the protrusions 20a. The cassette-mounted table 20 extends in a direction of an axis Y and the wafer cassette CR directs its open side, through which the wafer W is taken in and out, toward the process station 12. A wafer carrying robot 22 can move along the cassette-mounted table 20. It can also move in directions of axes Y and Z and further rotate round a vertical axis by an angle θ. It can gain access to any desired cassette, responsive to a command applied from a controller (not shown). It can also gain access to an alignment unit (ALIM) and an extension unit (EXT) shown in FIG. 3.

Figure 4:
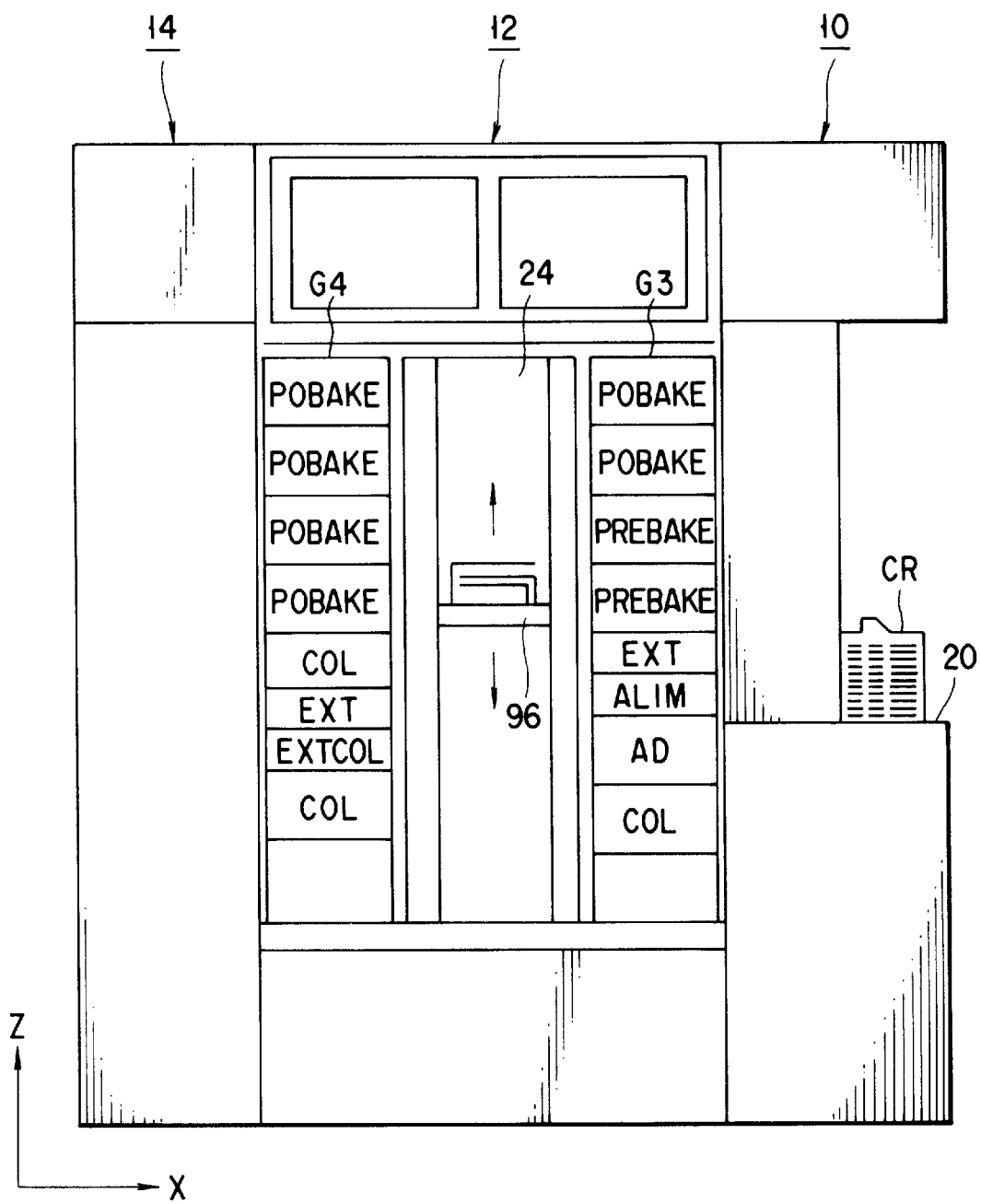
FIG. 4 is a rear view showing the coating and developing system.

As shown in FIG. 2, a main wafer carrier mechanism 24 of the vertical type is arranged in the center of the process station 12. Five sets of unit assembles G1, G2, G3, G4, and G5 are arranged around the main wafer carrier mechanism 24. Each of the unit assembles G1, G2, G3, G4, and G5 includes various kinds of process unit. As shown in FIG. 3, first and second unit assemblies G1 and G2 are arranged side by side on the front side of the system. As shown in FIG. 4, the third unit assembly G3 is arranged adjacent to the cassette station 10 and the fourth unit assembly G4 is arranged adjacent to the interface section 14. As shown in FIG. 2, the fifth unit assembly G5 is arranged on the rear side of the system.

As shown in FIG. 3, wafers W mounted on spin chucks 60 are rotated in cups 8 in resist-coating and developing units (COT) and (DEV) of the first unit assembly G1. The resist coating unit (COT) is arranged under the resist developing unit (DEV). Similarly in the second assembly G2, the resist coating unit (COT) is arranged under the resist developing unit (DEV).

As shown in FIG. 4, the third unit assembly G3 includes cooling (COL), adhesion (AD), alignment (ALIM), extension (EXT), pre-baking (PREBAKE) and post-baking (POBAKE) units stacked one upon the others from the below in this order in eight steps. Similarly, the fourth unit assembly G4 includes cooling (COL), extension and cooling (EXTCOL), extension (EXT), cooling (COL), pre-baking (PREBAKE) and post-baking (POBAKE) units stacked same as in the third unit assembly G3.

Thus, when the cooling (COL) and extension/cooling (EXTCOL) units in which process temperature is low are arranged, as lower steps, in lower portion of the system, while arranging the pre-baking (PREBAKE), post-baking (POBAKE) and adhesion (AD) units, in which process temperature is high, as higher steps, in higher portion of the system, thermal interference between the units can be made less.

The interface section 14 has in the Y axis direction a size substantially same as but in the X axis direction a size smaller than that of the process station 12. A pickup cassette CR of the carry type and a buffer cassette BR of the stationary type are arranged one upon the other on the front side of the interface section 14. A peripheral exposing unit 28 is arranged on the rear side thereof. The robot 26 can move in Y and Z axes directions to gain access to both of the cassettes CR and BR and to the peripheral exposing unit 28. It can also move round the vertical axis by an angle θ to gain access to the extension unit (EXT) of the process station 12 and to the wafer-transfer mechanism (not shown) of the exposure apparatus.

Next, the following will explain the developing unit (DEV) with reference to FIGS. 6 to 10.

As shown in FIG. 6, a cylindrical cup 8 is arranged in the developing unit (DEV) and a spin chuck 60 is arranged inside the ring-shaped cup 8 in the center thereof. The wafer W is carried into the unit (DEV) and mounted on the spin chuck 60 by the robot 24. The spin chuck 60 holds the wafer W, using vacuum suction, and it is rotated by a drive motor 62. A power supply for the motor 62 is connected to the output side of a controller 180, and its rotation number is thus controlled depending upon conditions under which the wafer W is processed. Waste liquid and gas caused in the cup 8 are exhausted into a trap tank (not shown) through a drain passage 69, which is communicated with the pumping side of an exhaust pump 170.

The ring member 66 is attached to the top of an inner side wall 64 of the cup 8 and a small clearance 67 is provided between the ring member 66 and the underside of the wafer W. A cylindrical bottomed box 68 is attached to an inner vertical side o the ring member 66, enclosing the spin chuck 60, to thereby form a buffer chamber 65. One or plural gas inlets 68a are formed in the bottom of the box 68 and gas is thus introduced from a gas supply source 160 into the buffer chamber 65 through the gas inlets 68a. N2 gas or clean air is stored in the gas supply source 160. Gas introduced into the buffer chamber 65 flows into the drain passage 69 through the narrow clearance 67. Thus, there is formed air current flowing from the inside of the wafer W to the outside along the rear surface of the wafer peripheral portion thereof.

As shown in FIG. 2, a developer solution supply nozzle 70 is arranged in the developing unit (DEV) of the second unit assembly G2. It can move in the Y axis direction and it is made of fluorine resin, excellent in corrosion proof and difficult to cause particles.

As shown in FIG. 5, the nozzle 70 is supported by a horizontal arm 76 through a vertical support rod 72 and a joint member 74. As shown in FIG. 2, the horizontal arm 76 is connected to a block 144 of a belt drive mechanism 140, and the block 144 is fixed to a belt 142. The belt 142 is stretched between a pair of pulleys 146 and 148, and the drive pulley 146 is connected to a rotation shaft of a motor 150. When the motor 150 is driven and rotated, the nozzle 70 is moved like a line in the X axis direction by the belt drive mechanism 140. The moving stroke of the nozzle 70 ranges from the outer position (home position P0) of the cup 8 to the center portion (solution-swelling position) thereof.

Figure 7:
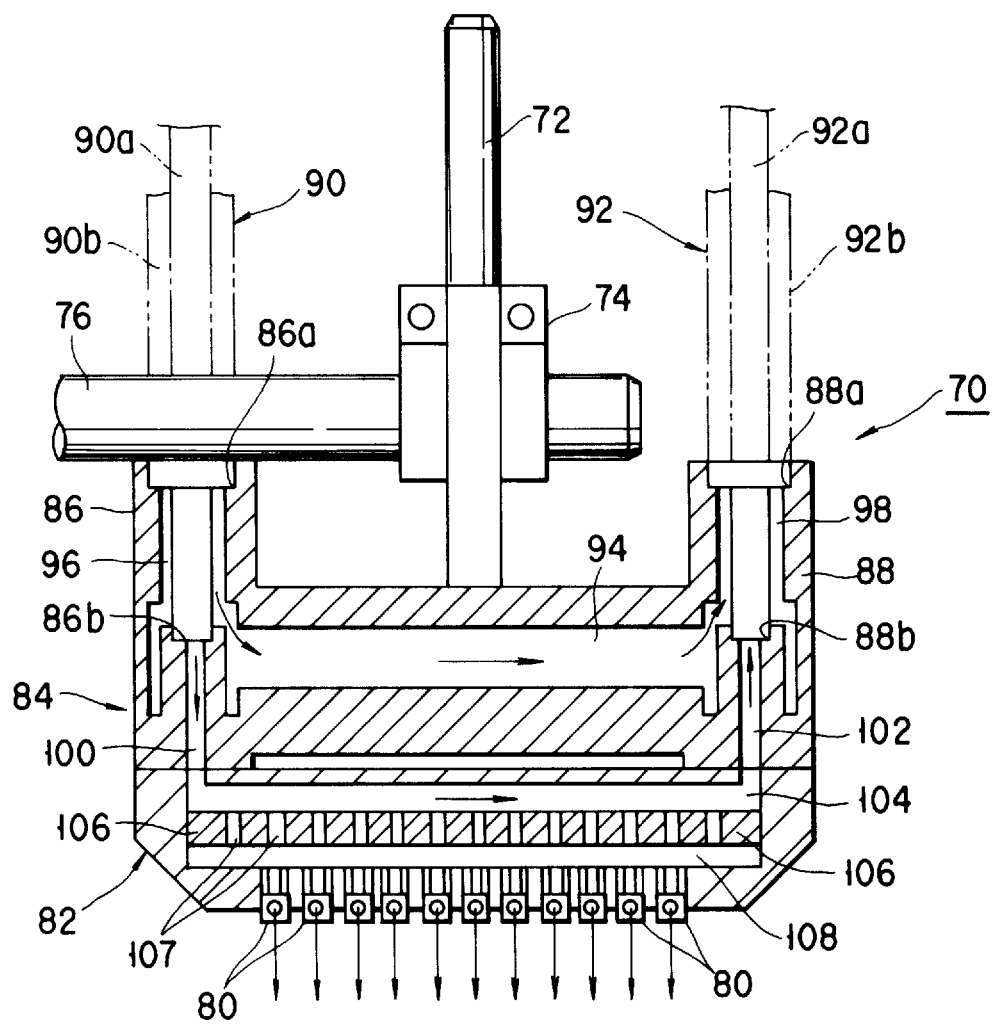
FIG. 7 is a vertically-sectioned view showing a developer solution supply nozzle.
Figure 8:
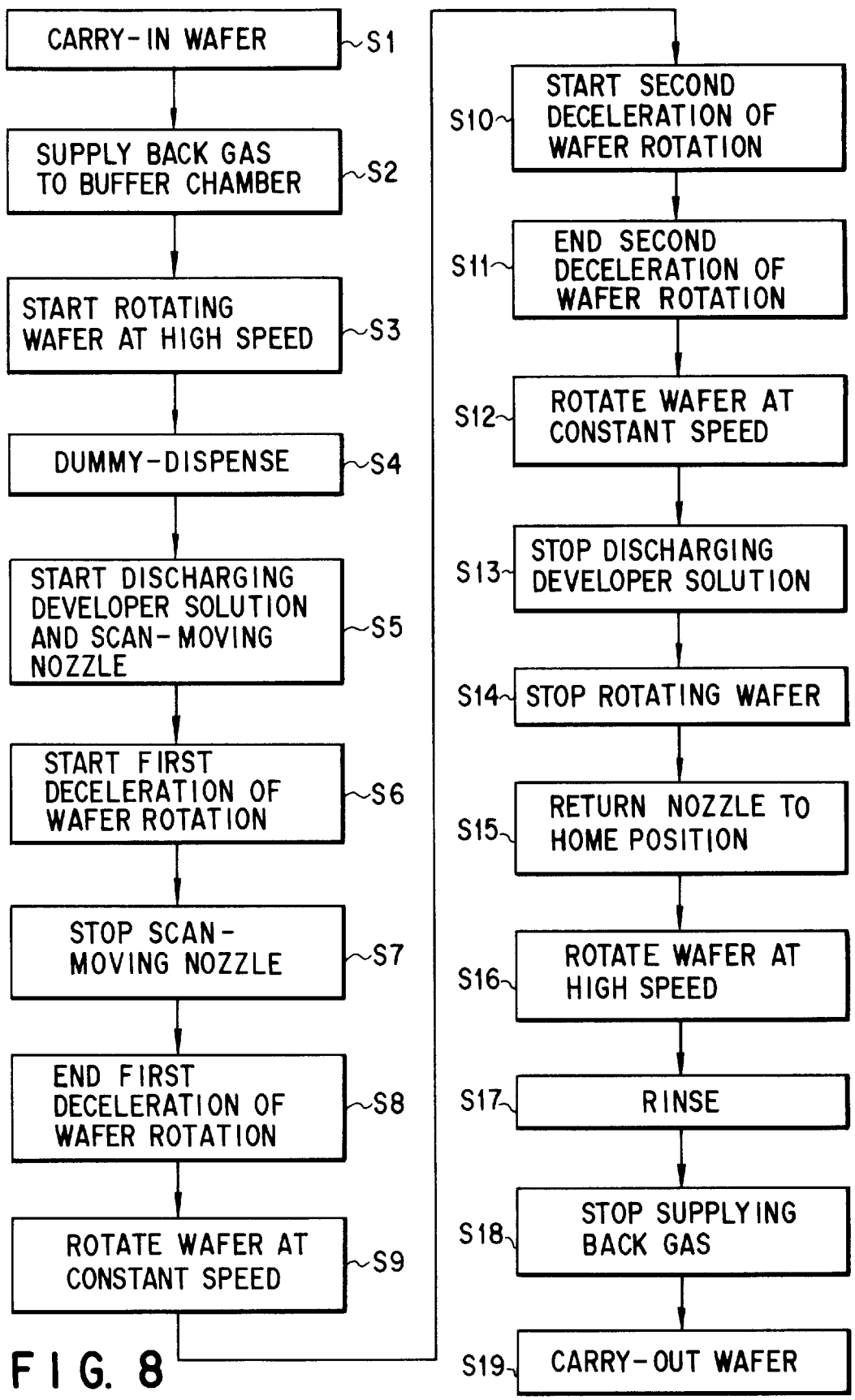
FIG. 8 is a flow chart showing the developing method according to the embodiment of the present invention.

As shown in FIG. 7, the nozzle 70 has a bottom (solution discharging) portion 82, which is formed like a line, and which is provided with a plurality of solution discharging apertures 80, which are arranged in a line. Their pitch is about 6 mm and their diameter is about 1.8 mm. The length of the linear bottom portion 82 is about 42 mm for 6-inch wafer, about 60 mm for 8-inch wafers, and about 84 mm for 12-inch wafers. It is preferable that the length of solution discharging apertures 80 arranged in a line is in a range of 1/5 to ½ of wafer diameter.

Passages of first and second routes are formed in the nozzle 70. Passages 100, 102, and 104 belonging to the first route are communicated with a developer solution supply source 165 through inner pipes 90a and 92a to enable developer solution 2 to flow through them. Passages 94, 96, and 98 belonging to the second rout are communicated with a temperature adjusting water supply source (not shown) through outer pipes 90b and 92b to enable temperature-adjusted water to flow through them. The solution discharging portion 82 and a temperature adjusting section 84 may be made of metal such as stainless steel or aluminum.

A pair of cylindrical pipe junctions 86 and 88 are projected from both ends of the rear side surface of the temperature adjusting section 84 when viewed from the solution discharging portion 82 of the nozzle 70. A pair of double pipes 90 and 92, which comprise inner pipes 90a and 92a, and outer pipes 90b and 92b, are connected to the pipe junctions 86 and 88. The outer pipes 90a and 92a are attached to temperature adjusting water ports 86a and 88a which are adjacent to open ends of the pipe junctions 86 and 88, having a relatively larger diameter. The inner pipes 90b and 92b are attached to developer solution ports 86a and 88b of the junctions 86 and 88.

The temperature adjusting water passage 94 in the temperature adjusting section 84 extends parallel to the line of nozzle apertures 80. The temperature adjusting water passage 94 is communicated with the developer solution supply pipe 90 and temperature adjusting water ports 86a and 88a through passages 96 and 98 formed round developer solution ports 86b and 88b, respectively. Temperature adjusting water is introduced to the port 86a through passages 96, 94, and 98, and returned to the temperature water supply source through the other pipe 92.

In the discharging portion 80, there is formed the passage 104, which is communicated with the developer solution ports 86b and 88b through the passages 100 and 102. A straightening vane or plate 106 has plurality of holes 107, which are communicated with a solution reservoir 108. The solution reservoir 108 is communicated with each of the solution discharging apertures 80. After being introduced into the passage 104, a part of developer solution 2 is passed into the solution reservoir 108 through the holes 107 of the straightening plate 106 and discharged through the apertures 80, while the other part of it is returned to the developer solution supply source 165 through the inner pipe 92a.

The developer solution 2 supplied to the nozzle 70 is kept certain in temperature in the pipe 90a and the discharging section 80 by the temperature adjusting pipe 90b and temperature adjusting section 84. As a result, developer solution 2 can be discharged in a good state. In this case, at the nozzle standby position (home position) P0, developer solution 2 is dummy-dispensed periodically or as required to discard the dried and deteriorated developing solution at the top of the nozzle 70. Also, as shown in FIG. 5, the solution discharging apertures 80 of the nozzle 70 are directed obliquely downward in such a way that the developer solution 2 can be discharged to the water W through the apertures 80 by an angle of $\theta_1$. The angle $\theta_1$ is set to be about 45° in this case.

Figure 6A:
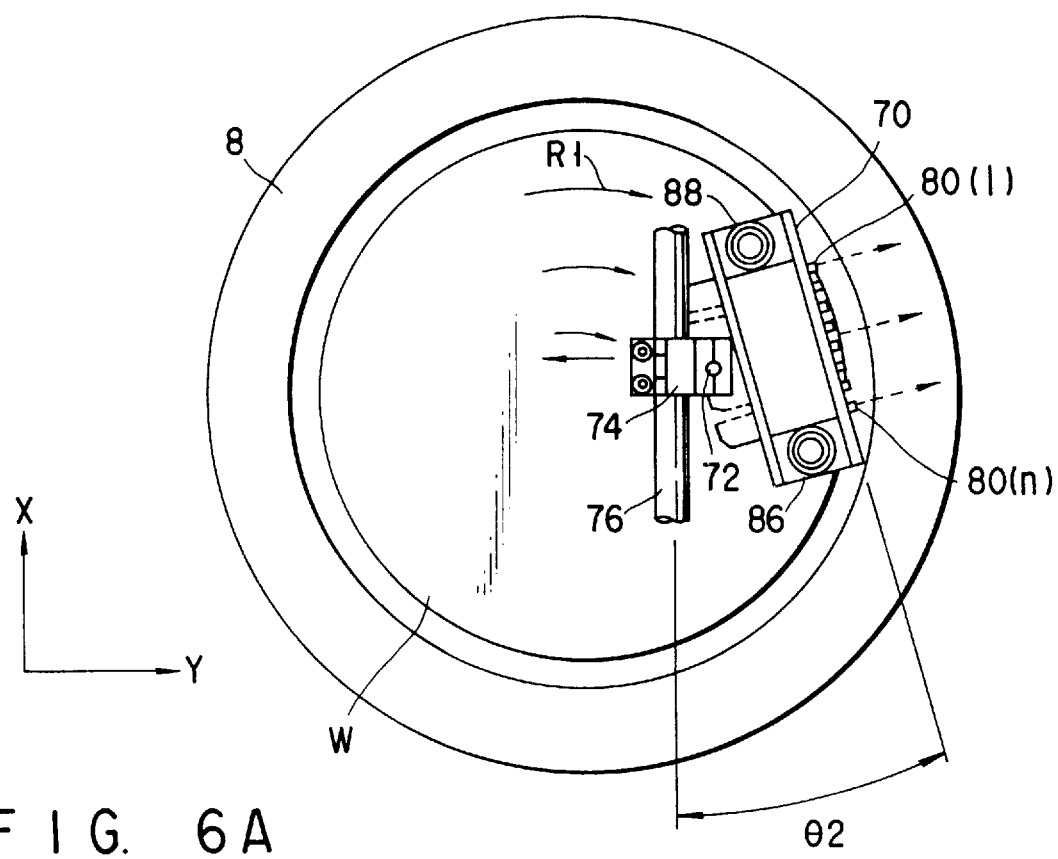
FIG. 6A is a plan view showing the positional relationship between a nozzle and a wafer at a starting time of discharging developer solution.
Figure 6B:
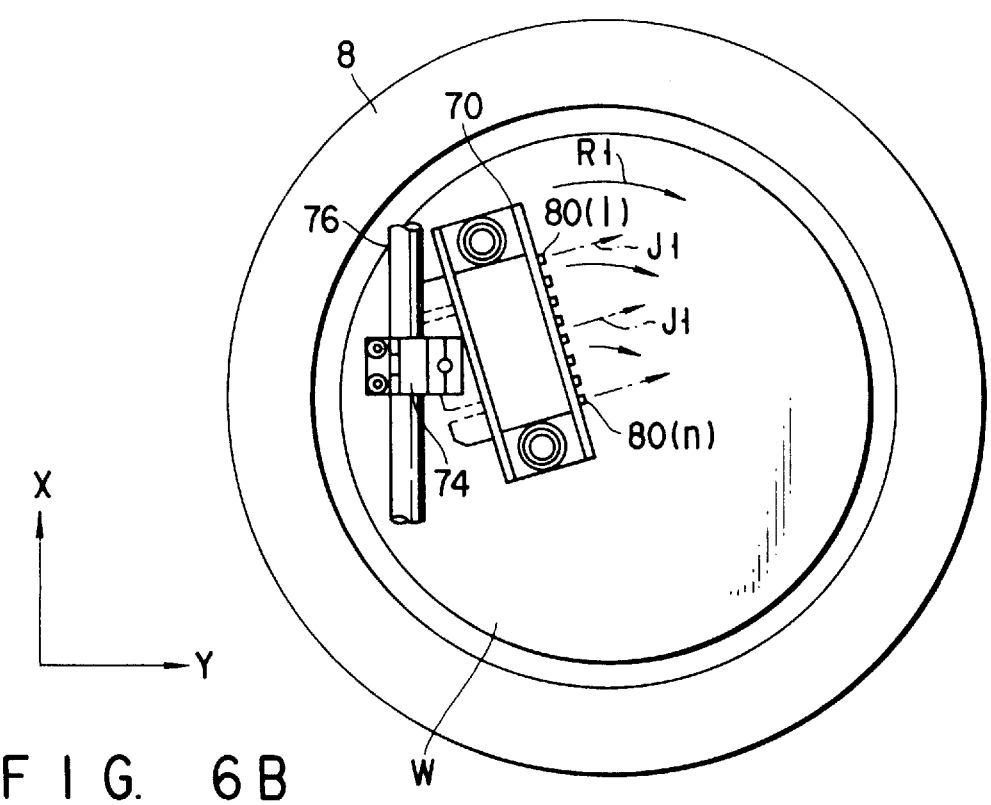
FIG. 6B is a plan view showing the positional relationship between the nozzle and the wafer at a scan-movement end time.

As shown in FIGS. 6A and 6B, the nozzle 70 is not parallel to the horizontal arm 76 but it is attached to the arm 76 at an angle of $\theta_2$ when viewed in a plane. The line of the discharging apertures 80 is thus tilted relative to the axis Y by the angle $\theta_2$. The angle $\theta_2$ is set to be about 10° in this case. It is preferable that the angle $\theta_2$ is in a range of 5° to 24°.

The following will explain the method for developing photoresist coated on the semiconductor wafer W by use the developing unit (DEV) with reference to FIGS. 8, 9A to 9F, 10, and 11A to 11C.

Figure 9A:
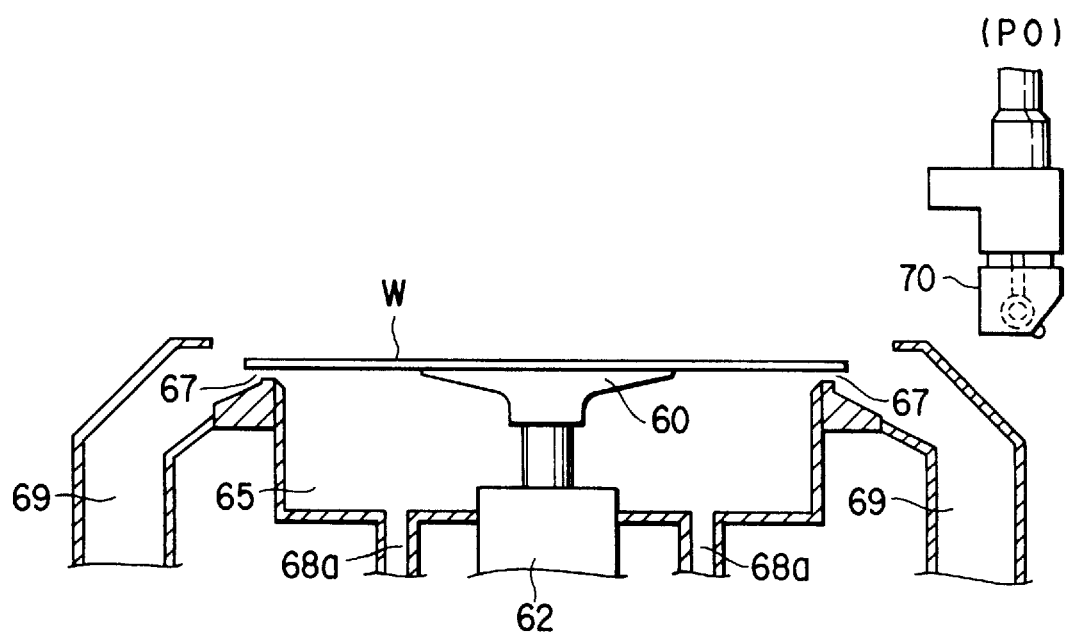

An 8-inch silicon wafer W is coated with chemically amplifying typed photoresist, baked and then pattern-exposed. The wafer W is carried out of the exposing unit (not shown) and into the developing unit (DEV) (step S1). As shown in FIG. 9A, the wafer W is vacuum-attracted and held by the spin chuck 60. At this time, the nozzle 70 is at the home position P0.

The cup 8 is exhausted through the drain passage 69 while $N_2$ gas is supplied to the buffer chamber 65 through the passages 68a (step S2). Thereby, N2 gas current flowing from the buffer chamber 65 into the passage 69 through the clearance 67 is generated. This gas current flows through the clearance 67 from inside to outside, thereby preventing the developer solution 2 from coming from the top surface of the wafer W onto the undersurface of the wafer W. The gas current flows, due to orifice effect, particularly at the clearance 67 at a higher speed. The developer solution 2 can be thus fully prevented from coming onto the undersurface of the wafer W. The wafer W is rotated at first rotation speed N1 (about 1000 rpm) by the spin chuck 60 (step S3).

Figure 9B:
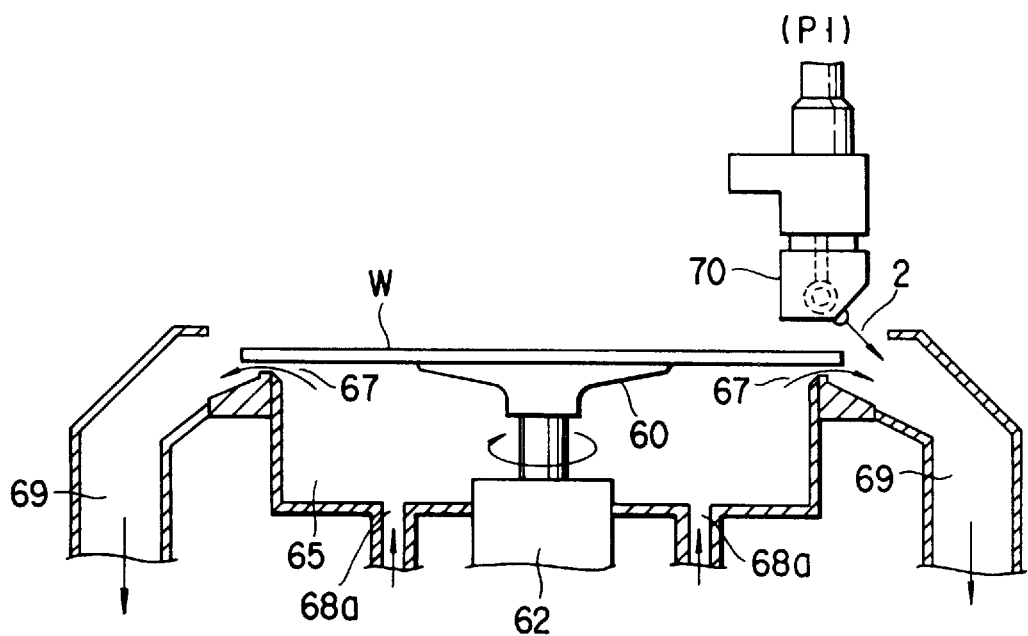

As shown in FIG. 9B, the nozzle 70 is moved from the home position P0 to the first position P1, and the developer solution 2 is dummy-dispensed into the drain passage 69 for about 0.3 to 0.5 seconds (step S4). The developer solution 2 is water solution containing tetramethyl ammonium hydro oxide (TMAH) of 2.38 wt %. In the present invention, there is a case in which solution having activator suitably added to TMAH solution of 2.38 wt % is used as developer solution 2.

Figure 9C:
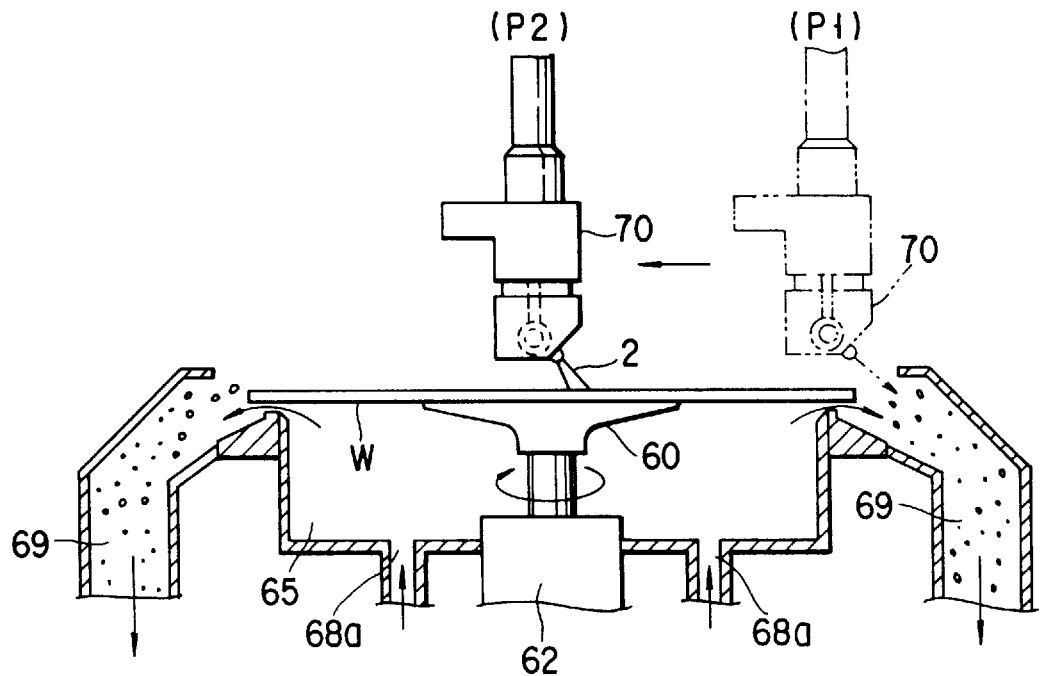

As shown in FIG. 9C, during the rotation of the wafer W at high speed, the discharge of the developer 2 is started and the scan-movement of the nozzle 70 is started (step S5). As shown in FIG. 6A, it is preferable that developer solution 2 discharged from discharge ports 80 (1) and 80 (n) of both ends of the nozzle 70 mount on the peripheral portion of the wafer W substantially at the same time just after the scan-movement of the nozzle 70 is started. The scanning speed of the nozzle 70 is in a range of 40 to 150 mm/sec. This area of the wafer W scanned by the nozzle 70 depends on the number of apertures 80 and their area, and it is usually set to be about ¼ of the wafer area. In this case, it is preferable that the nozzle 70 scans the wafer W with its line of apertures 80 kept substantially perpendicular to the rotating direction of the wafer W. A clearance between the nozzle 70 and the wafer W is set to be in a range of 2 to 10 mm. The nozzle 70 continues to discharge the developer solution 2 from step 4 to step 12. The flow rate of discharging the developer solution 2 is set to, for example, 0.8 lit./sec.

As shown in FIG. 5, when the developer solution 2 is discharged to the wafer W at the angle $\theta_1$, as shown in FIG. 6B, its movement vector J1 is directed to be substantially the same as the rotation movement vector R1, thereby allowing it to follow the movement of the wafer W. This enables it not to jump against the wafer W but to sold-land on it. In this case, when the rotation speed of the wafer W is 30 rpm, it is preferable that its discharged angle $\theta_1$ is in a range of 30° to 60°, more preferably 45°. Moreover, when the wafer rotation speed becomes higher than 30 rpm, it is preferable that its discharged angle $\theta_1$ is made smaller than 45°, preferably in a range of 15° to 45°.

Figure 10:
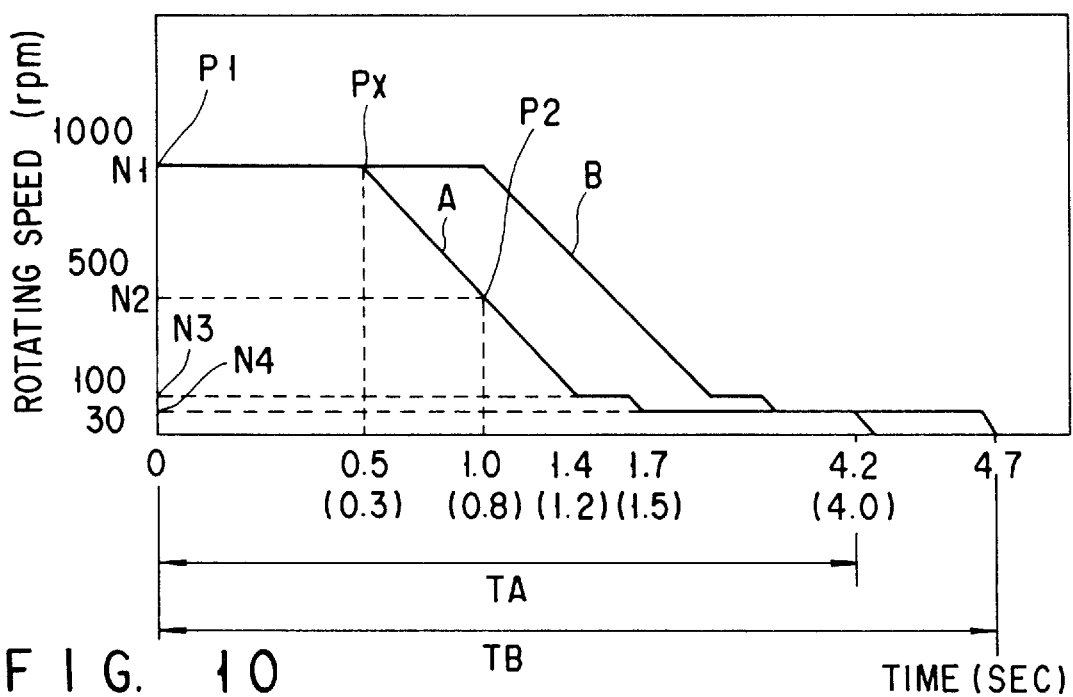
FIG. 10 is a timing chart explaining the developing method according to the embodiment of the present invention.
Figure 11A:
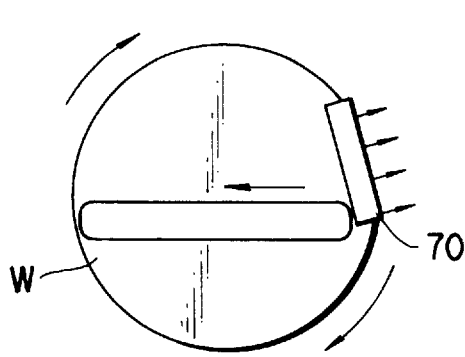
FIGS. 11A to 11C are plan schematic views showing the states of the nozzle and wafer of each developing process.
Figure 11B:
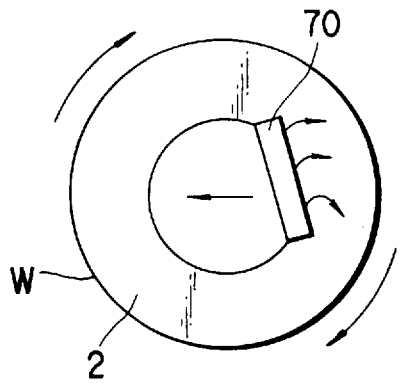
Figure 11C:
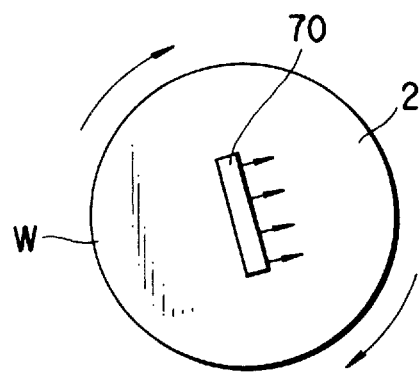
Figure 12:
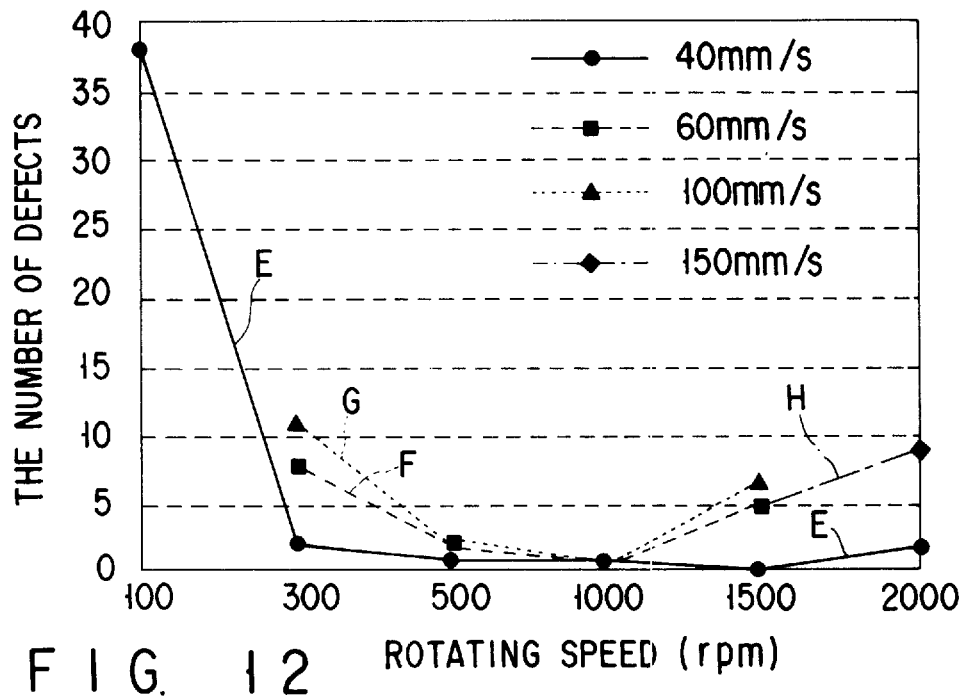
FIG. 12 is a characteristic line view showing the relationship between the number of spin-rotations of the wafer and the number of developing defects with respect to each scan moving speed of the nozzle.
Figure 13:
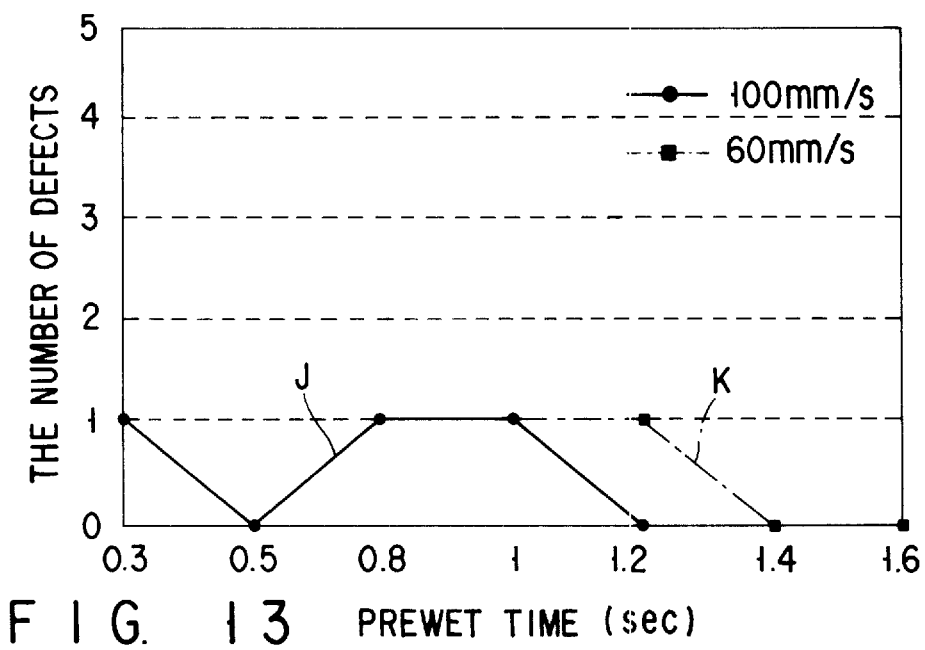
FIG. 13 is a characteristic line view showing the relationship between pre-wet time and the number of developing defects.

During the scan-movement of the nozzle 70, the rotation of wafer W is started to be decelerated (step S6). A series of processes, which is from the start of the first deceleration (step S6) to the stop of discharging of developer solution (step S13), will be specifically explained with reference to FIG. 10. FIG. 10 is a timing chart showing the rotation control of the wafer during the developing. In this figure, a horizontal axis shows a lapse of time (second) from the start of developer solution discharging to wafer W, a vertical axis shows a wafer rotation speed (rpm). Moreover, a characteristic line A shows an embodiment in which a wafer with 8-inch diameter is developed by the developing method of the present invention, and a characteristic line B shows a comparison in which a wafer with 8-inch diameter is developed by a conventional developing method.

As is obvious from the figure, developer solution discharging time TA (4.2 seconds) of the embodiment (characteristic line A) was reduced by 0.5 (seconds) than the developer solution discharging time TB (4.7 seconds) of the comparison (characteristic line B). In the conventional case, the deceleration of the wafer rotation was started after the completion of the scan-movement of the nozzle (1.0 second after the start of the developer solution discharging to the wafer; nozzle position P2). In the present invention, the deceleration of the wafer rotation is started during the scan-movement of the nozzle (0.5 seconds after the start of the developer solution discharging to the wafer; nozzle position Px). In other words, the controller 180 drive-controls the spin chuck 60 such that the rotation speed of wafer W is kept to be the first rotation speed (1000 rpm) till the nozzle movement position Px. Also, the controller 180 drive-controls the spin chuck 60 such that the deceleration of the rotation speed is started from the position Px. Moreover, the controller 180 drive-controls the spin chuck 60 such that the rotation speed of wafer W is set to be the second rotation speed N2 (about 500 rpm) at the second nozzle position P2. The above-fixed rotation pre-wet time can be reduced to 0.3 seconds from 0.5 seconds, and developing solution discharging time TA can be set to 4.0 seconds. As a result, developer solution discharging time TB can be set to be shorter than the conventional case by 0.7 seconds.

As shown in FIG. 6B, solution discharging apertures 80 of the innermost end portion stop the scan-movement of the nozzle 70 at the position where the discharging aperture 80 passed over the wafer rotation shaft a little (step S7). In this case, required time, which is from the start of the scan-movement of the nozzle 70 to the stop of the scan-movement, is about 1.0 second. During the scan-movement of the nozzle 70, developer solution 2 is completely shaken off from the wafer W by centrifugal force without forming the liquid film on the wafer W.

After the scan-movement of the nozzle 70 is stopped, the first deceleration is ended at the time when the wafer rotation speed drops to 100 rpm (step S8). End time of the first deceleration is about 1.4 seconds after the start of the developer solution discharging to the wafer W. The wafer W is rotated for only about 0.3 seconds at the constant speed of 100 rpm (step S9). A process for supplying developer solution 2 onto coated resist at the third rotation speed N3 is performed for about 0.3 seconds. Thereby, the thickness of the liquid layer of the developer solution, which is from the center area of the wafer to the peripheral area, is increased. The shift from the first rotation speed N1 (1000 rpm) to the third rotation speed N3 (100 rpm) is performed at a fixed deceleration. The first deceleration is preferably set to be in a range of 1000±100 rpm/sec. Since the deceleration width from the third rotation speed N3 (100 rpm) to the fourth rotation speed N4 (30 rpm) is small, the deceleration may be arbitrarily selected. For example, it can be set to be in a range of 1000 to 1500 rpm/sec.

Figure 9D:
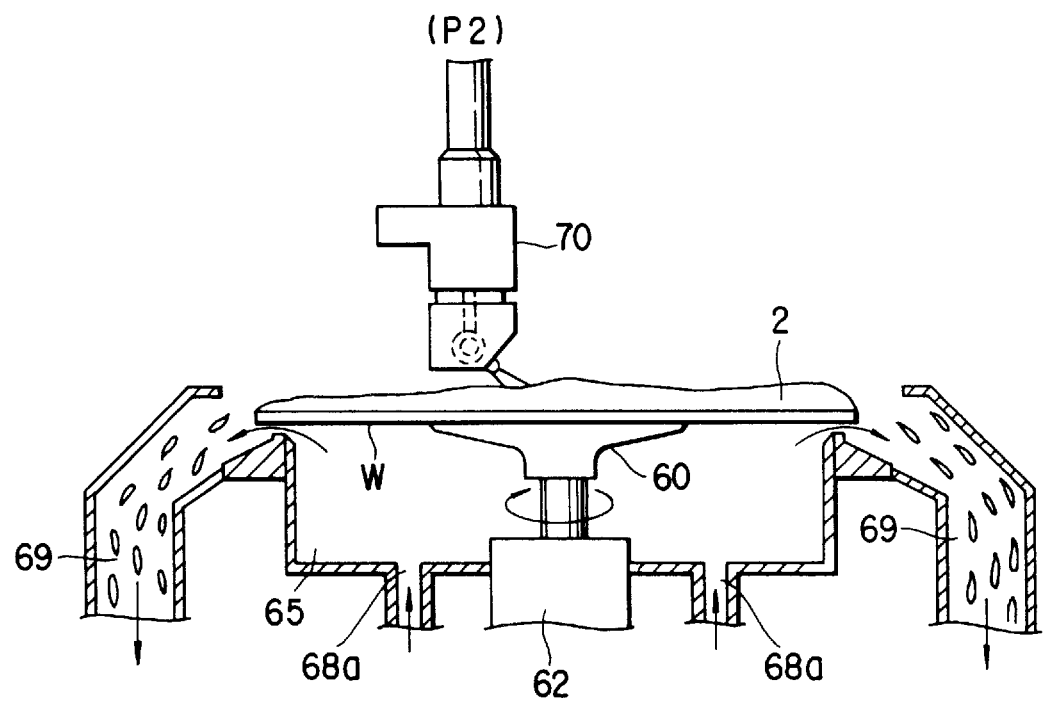

Next, the second deceleration of the wafer rotation is started (step S10). When the wafer rotation speed reaches 30 rpm (third rotation speed N3), the second deceleration is ended (step S11). The required time of the first stage of the deceleration (from 1000 rpm to 100 rpm) is about 0.9 seconds. The required time of the second stage of the deceleration (from 100 rpm to 30 rpm) is 0.05 to 0.10 seconds. The reason why the wafer rotation speed is decelerated in a two-step manner is as follows:

More specifically, if the rotation speed of the wafer W is rapidly reduced from 1000 rpm to 30 rpm, developer solution 2 gathers too much on the center portion of the wafer W as shown in FIG. 1, and serious developing defects easily occur. As shown in FIG. 9D, at time of deceleration in a one step manner, the thickness of the liquid film of developer solution 2 on the wafer W becomes slightly uneven, but no serious developing detects occur.

As shown in FIG. 9E, it is assumed that the wafer rotation speed is kept to be 30 rpm (fourth rotation speed N4) while discharging developer solution 2 from the nozzle 70 at 0.8 lit./sec. The amount of supplying developer solution 2 to wafer W and the amount of natural drop of developer solution 2 from wafer W are balanced. As a result, a liquid film of developer solution 2 having substantially a uniform thickness is formed on wafer W (step S12). Then, the wafer W is rotated at the constant speed of 30 rpm for about 2.5 seconds, and the coated resist is developed with developer solution 2.

As shown in FIG. 9F, the discharge of developer solution 2 through the nozzle 70 is stopped (step S10), the nozzle 70 is once retreated to the first position P1. Moreover, the nozzle 70 is returned to the home position P2 (step S15).

When the rotation speed of wafer W is raised instantly from 30 rpm to 1000 rpm to rotate the wafer W at high speed (step S16). Then, a rinse nozzle (not shown) is positioned above the wafer W and cleaning solution is sprayed on the wafer W from the rinse nozzle for a predetermined period of time to completely remove the developing solution 2 (step S17).

After this rinsing, the rotation of the wafer W is stopped, and the supply of back gas into the buffer chamber 65 is stopped (step S18), while keeping the drain 69 being exhausted. Then, the vacuum, absorption, and holding of the spin chuck are is released, so that the wafer W is carried from the developing unit (DEV) (step S19). One cycle process time, which is from step S1 to step S19, is about 12 to 14 seconds.

Next, the following will explain the result of the survey of the number of developing defects when time (pre-wet time), which is from step S5 to step S6, is further decreased to reduce developer solution discharge time TA and the wafer rotation is decelerated while scan-moving the nozzle 70.

In this case, time for scanning about 80% of a radius (100 mm) of 8-inch diameter wafer is set as standard pre-wet time (e.g., if the scan-moving speed of the nozzle is 100 mm/sec., pre-wet time is 0.8 seconds). If the scan-moving speed of the nozzle 70 is set to be higher than the wafer rotation speed, pull back occurs. If the scan-moving speed of the nozzle 70 is set to be lower than the wafer rotation speed, discharging time of developer solution 2 is increased. For this reason, both speeds are set to be the same.

It is assumed that the rotation number N1 is 1000 rpm. Pre-wet time can be reduced to 1.0 second (60% of wafer radius) when the scan-moving speed of the nozzle is 60 mm/sec. Pre-wet time can be reduced to 0.3 seconds (30% of wafer radius) when the scan-moving speed of the nozzle is 100 mm/sec. In either case, the wafer rotation number N2 is decreased to 300 rpm when the nozzle 70 reaches the center portion of the wafer W. However, no developing detects are not generated. Therefore, pre-wet time can be reduced in the range that the rotation number N2 is decelerated to 300 rpm, which is obtained when the nozzle 70 reaches the center portion of the wafer based on the set wafer rotation number and the set nozzle scan-moving speed.

In the above embodiment, the first rotation speed N1=1000 rpm, the second rotation speed N2=500 rpm, the third rotation speed N3=100 rpm, and the fourth rotation speed N4=30 rpm. However, the second rotation speed N2 can be variously set to the other values if it is in the range of 300 rpm to 500 rpm.

The embodiment explained the case in which the semiconductor wafer coated with resist was processed. However, the present invention is not limited to such a case. The present invention can be used in a glass substrate for LCD.

According to the present invention, the following excellent advantage can be obtained:

Specifically, since developer solution discharging time can be reduced as compared with the conventional case, an amount of consumption of developer solution can be greatly reduced, and through-put can be improved.

Additional advantages and modifications will readily occur to those skilled in the art. Therefore, the invention in its broader aspect is not limited to the specification details, representative devices, and illustrated examples shown and described herein. Accordingly, various modifications may be made without departing from the spirit or scope of the general inventive concept as defined by the appended claims and their equivalents.

I claim:

1. A developing method for developing photoresist coated on a substrate with developing solution comprising the steps of:

(a) keeping the substrate substantially horizontally such that a resist-coated surface is placed at a top portion;

(b) starting a rotation of the substrate at a first rotation speed N1, starting discharging developing solution from a nozzle at a position where the substrate is prevented from being applied thereon during the rotation of the substrate, and starting scan-moving the nozzle along the substrate as discharging developing solution;

(c) starting a first deceleration for decelerating the rotation of the substrate while the nozzle is scan-moving;

(d) stopping the scan-movement of the nozzle above a central area of the substrate when the rotation of the substrate reaches a second rotation speed N2;

(e) ending the first deceleration when the rotation of the substrate reaches a third rotation speed N3; and (f) starting a second deceleration for decelerating the rotation of the substrate from the third rotation speed N3 to a fourth rotation speed N4 after rotating the substrate at the third rotation speed N3, ending the second deceleration when the rotation of the substrate reaches at the fourth rotation speed N4, and supplying developing solution onto the substrate while the substrate is being rotated at the fourth rotation speed N4 such that a liquid film of developing solution having substantially a uniform thickness is formed on the substrate to develop the resist coated on the substrate.

2. The method according to claim 1, wherein the second rotation speed N2 is set to be in a range of 300 rpm or more to 500 rpm or less in the step (d).

3. The method according to claim 1, wherein the second rotation speed N2 is set to be 500±5 rpm in the step (d).

4. The method according to claim 1, wherein the first deceleration is set to be in a range of 1000±100 rpm/sec in the steps (c) to (e).

5. The method according to claim 1, wherein 60 to 80% of the area of the resist-coated surface contacts developing solution when the rotation of the substrate reaches the second rotation speed N2 in the step (d).

6. The method according to claim 1, wherein 60±5% of the area of the resist-coated surface contacts developing solution when the rotation of the substrate reaches the second rotation speed N2 in the step (d).

7. The method according to claim 1, wherein pre-wet time from the start of supplying developing solution onto the substrate from the nozzle till the first deceleration is started is set to be a range of 0.3 to 0.5 seconds in the steps (b) and (c).

8. The method according to claim 1, wherein the scan-moving time of the nozzle is set to be in a range of 0.8 to 1.0 second in the steps (b) to (d).

9. The method according to claim 1, wherein the scan-moving time of the nozzle is set to be in a range of 60 to 100 rpm/sec in the steps (b) to (d).

10. The method according to claim 1, wherein required time for the first deceleration is set to be 0.9 seconds in the steps (c) to (e).

11. The method according to claim 1, wherein process time at the fourth rotation speed N4 is set to 2.5 seconds in step (f).

12. The method according to claim 1, wherein the third rotation speed N3 is set to 100±5 rpm in the step (e).

13. The method according to claim 1, wherein the fourth rotation speed N4 is set to 30±2 rpm in the step (f).

14. The method according to claim 1, further comprising the step of stopping the supply of developing solution from the nozzle after the step (f) such that the substrate is rotated at the first rotation speed N1 to centrifuge developing solution on the substrate.

15. The method according to claim 1, wherein a clearance between the nozzle and the substrate is set to be in a range of 2 to 10 mm during the steps (b) to (f).

* * * * *